US011737224B2

(12) United States Patent
Suga et al.

(10) Patent No.: US 11,737,224 B2
(45) Date of Patent: Aug. 22, 2023

(54) ELECTRONIC DEVICE AND CONTAINER

(71) Applicant: SHARP KABUSHIKI KAISHA, Sakai (JP)

(72) Inventors: Katsuyuki Suga, Sakai (JP); Yuki Yasuda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 212 days.

(21) Appl. No.: 17/279,545

(22) PCT Filed: Sep. 28, 2018

(86) PCT No.: PCT/JP2018/036503
§ 371 (c)(1),
(2) Date: Mar. 24, 2021

(87) PCT Pub. No.: WO2020/065990
PCT Pub. Date: Apr. 2, 2020

(65) Prior Publication Data
US 2021/0345504 A1 Nov. 4, 2021

(51) Int. Cl.
*H05K 5/00* (2006.01)
*H05K 5/02* (2006.01)
*H01L 25/18* (2023.01)
*H10K 50/84* (2023.01)
*H10K 59/12* (2023.01)
*H10K 102/00* (2023.01)

(52) U.S. Cl.
CPC ........... *H05K 5/0247* (2013.01); *H01L 25/18* (2013.01); *H05K 5/0217* (2013.01); *H10K 50/84* (2023.02); *H10K 59/12* (2023.02); *H10K 2102/311* (2023.02)

(58) Field of Classification Search
USPC .......................... 361/755, 807, 809 and, 810
See application file for complete search history.

(56) References Cited

U.S. PATENT DOCUMENTS

| | | | |
|---|---|---|---|
| 8,001,711 B2* | 8/2011 | LaFarre | G09F 9/301 40/515 |
| 9,098,241 B1 | 8/2015 | Cho et al. | |
| 9,877,384 B2* | 1/2018 | Lee | H05K 1/028 |
| 2016/0029474 A1 | 1/2016 | Cho et al. | |
| 2016/0187929 A1* | 6/2016 | Kim | G06F 1/1643 345/184 |
| 2017/0031388 A1* | 2/2017 | Han | H01L 27/3244 |
| 2017/0071066 A1 | 3/2017 | Cho et al. | |
| 2017/0196103 A1 | 7/2017 | Cho et al. | |
| 2017/0367198 A1* | 12/2017 | Park | H04M 1/0268 |
| 2020/0209924 A1* | 7/2020 | Zuo | H04M 1/0237 |

FOREIGN PATENT DOCUMENTS

JP 2016024460 A 2/2016

* cited by examiner

*Primary Examiner* — Hung S. Bui
(74) *Attorney, Agent, or Firm* — ScienBiziP, P.C.

(57) ABSTRACT

An electronic device includes an electronic component having flexibility, a drive circuit substrate, a first support body capable of winding at least a portion of the electronic component around an outer face, and a second support body including a center axis that is the same axis as a rotation axis of the first support body and including an outer periphery having a length smaller than a length of an outer periphery of the first support body, the second support body being capable of winding at least a portion of the external connection cable around an outer face.

17 Claims, 17 Drawing Sheets

ELECTRONIC DEVICE AND CONTAINER

TECHNICAL FIELD

An aspect of the disclosure relates to an electronic device and a container of the electronic device.

Background Art

An organic light emitting diode (OLED) display that includes a light-emitting element and that does not require a backlight is known as the related art. In an OLED display, there is also a product of a thin type having flexibility, and, for example, the OLED display can be rolled and housed. PTL 1 discloses a display device capable of automatically winding a display.

CITATION LIST

Patent Literature

PTL 1: JP 2016-24460 A (published on Feb. 8, 2016)

SUMMARY OF INVENTION

Technical Problem

However, the related art described above has the following problem. In a case where an electronic component such as a display is wound by a support body, twisting of a cable through which a signal is supplied to the electronic component occurs and causes deterioration and disconnection of the cable.

An object of an aspect of the disclosure is to realize an electronic device capable of suppressing twisting of a cable.

Solution to Problem

To solve the problem described above, an electronic device according to an aspect of the disclosure is an electronic device including an electronic component having flexibility, a drive circuit substrate connected to the electronic component and an external connection cable through which a signal is propagated, a first support body capable of housing the drive circuit substrate, the first support body being capable of winding at least a portion of the electronic component around an outer face, and a second support body including a center axis that is the same axis as a rotation axis of the first support body and including an outer periphery having a length smaller than a length of an outer periphery of the first support body, the second support body being capable of winding at least a portion of the external connection cable around an outer face.

Advantageous Effects of Disclosure

According to an aspect of the disclosure, an electronic device capable of suppressing twisting of a cable can be realized.

DESCRIPTION OF EMBODIMENTS

First Embodiment

Figure 1:
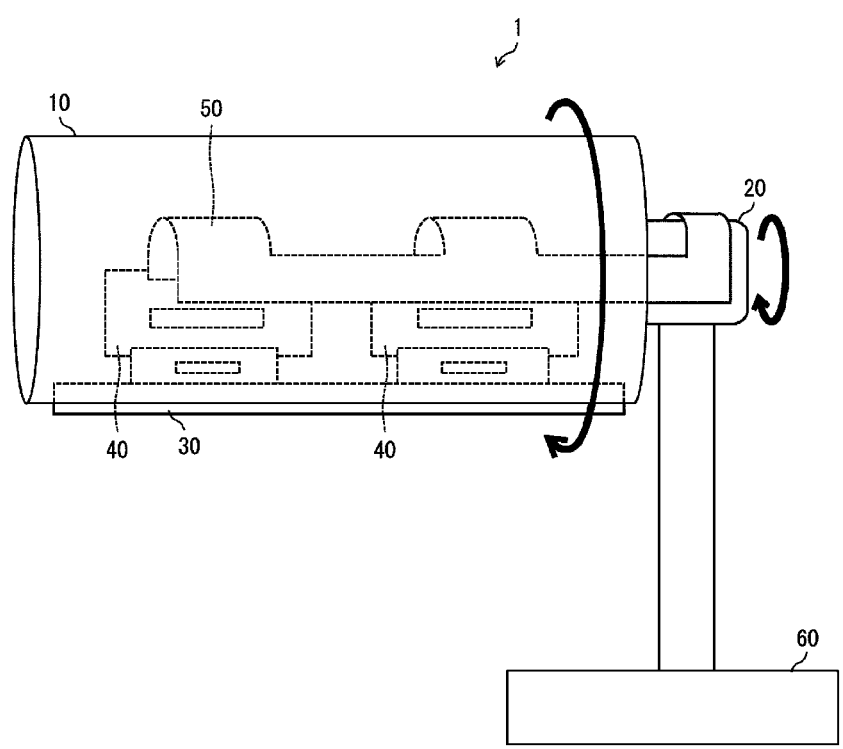
FIG. 1 is a schematic view of an electronic device according to a first embodiment.
Figure 2:
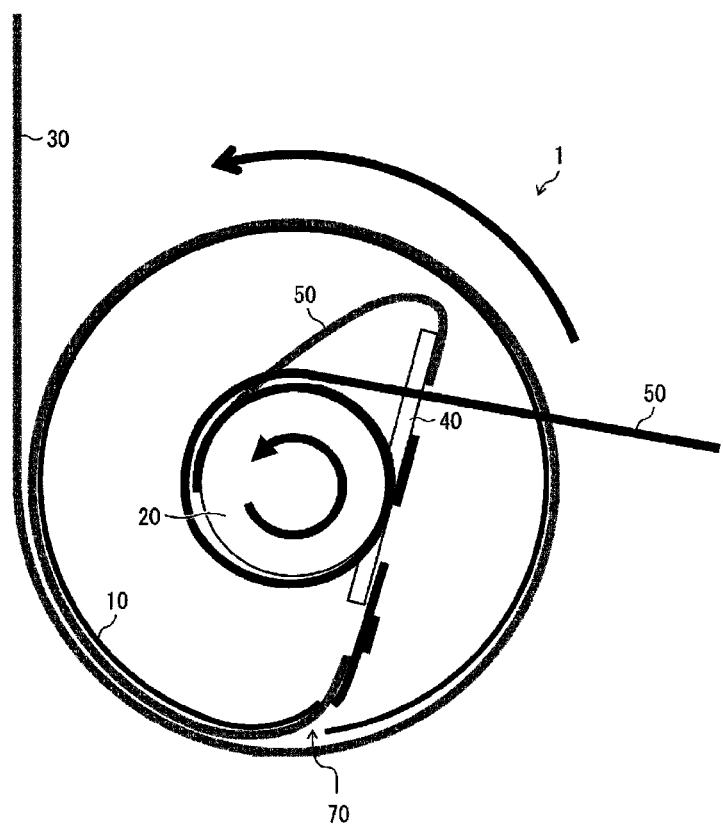
FIG. 2 is a cross-sectional view of an electronic device according to a second embodiment.

Hereinafter, an embodiment of the disclosure will be described in detail. FIG. 1 is a schematic view of an electronic device 1 according to the present embodiment. FIG. 2 is a cross-sectional view of the electronic device 1 according to the present embodiment.

As illustrated in FIG. 1, the electronic device 1 includes a first support body 10, a second support body 20, a display (electronic component) 30, a drive circuit substrate 40, an external connection cable 50, and an external controller 60.

The first support body 10 has a cylindrical shape and rotates about an axis by an electrical signal supplied by the external controller 60, a battery not illustrated, or the like. A slit 70 having a width through which at least the display 30 can pass is formed in the first support body 10.

In the electronic device 1, the inside of the first support body 10 includes a space containing at least the drive circuit substrate 40 illustrated and the like. In addition, as illustrated in FIG. 2, the drive circuit substrate 40 that the first support body 10 contains is connected via the slit 70 to the display 30 positioned in the exterior. The first support body 10 rotates, and accordingly, at least a portion of the display 30 can be wound around and housed in an outer face of the first support body 10.

The second support body 20 may be fixed to the first support body 10, and in a case where the first support body 10 rotates, the second support body 20 may rotate at the same rotation angle by the same rotation axis. In addition, the second support body 20 may be molded integrally with the first support body 10 or may be molded separately and fixed to the first support body 10. The second support body 20 rotates, and accordingly, at least a portion of the external connection cable 50 can be wound around and housed in an outer face of the second support body 20.

Note that the first support body 10 and the second support body 20 may be configured to automatically rotate by using electricity as a power source or may be configured to manually rotate.

Note that a shape of an outer periphery of each of the first support body 10 and the second support body 20 is preferably a circle and prevents a load from concentrating at a specific location of the display 30, but the shape may be, for example, an octagon or the like.

The display 30 is a display of a thin type having flexibility and, for example, is an organic light emitting diode (OLED) display. Hereinafter, description will be made assuming that a shape of the display 30 is a rectangle, but the shape of the display 30 may be, for example, a shape including a curved line. Note that a detailed configuration example of the display 30 will be described below.

Note that the electronic device 1 may include, instead of the display 30, an electronic component such as an x-ray sensor or a pressure sensor having flexibility. In other words, a target that the first support body 10 winds may be an electronic component having flexibility such as a display, an x-ray sensor, or a pressure sensor.

One end of the display 30 is connected to the drive circuit substrate 40 via a terminal portion T described below. The drive circuit substrate 40 is a circuit substrate that drives the display 30.

The external connection cable 50 is a cable through which a signal is supplied. One end of the external connection cable 50 is connected to a portion of the drive circuit substrate 40, for example, a side opposite to a side to which the display 30 is connected in the drive circuit substrate 40, and the other end of the external connection cable 50 is connected to the external controller 60. In addition, the external connection cable 50 is a flat type cable, that is, a flat cable capable of lap winding, and as illustrated in FIG. 1, the external connection cable 50 is bent in a direction in which the external connection cable 50 is wound without a twist on the second support body 20.

In addition, in addition to an image signal representing an image to be displayed by the display 30, a signal transmitted through the external connection cable 50 also include an electrical signal that becomes a power source. That is, the external connection cable 50 also functions as a power supply cable.

The external controller 60 is a device that becomes a supply source of a signal. Note that, a type of an image to be displayed by the display 30, or display timing of the image, and the like may be able to be specified by a user operation with respect to the external controller 60 or a device (not illustrated) connected to the external controller 60.

Electronic Device According to Comparative Example

Figure 3:
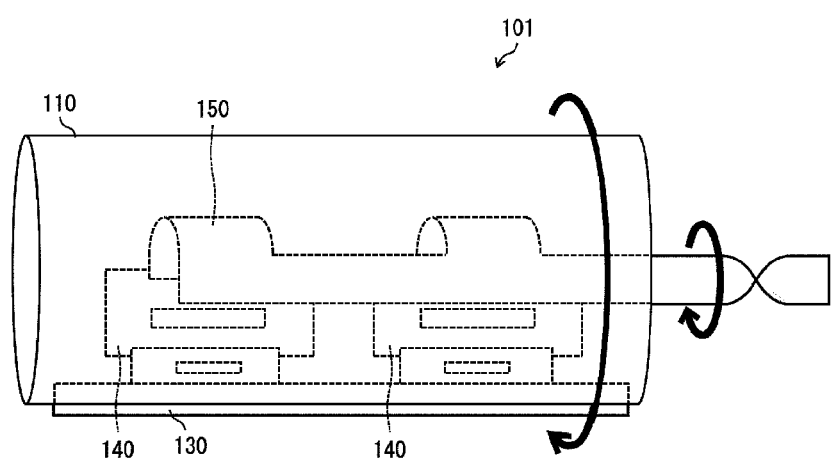
FIG. 3 is a schematic view of an electronic device according to a comparative example.

To clarify effects of the electronic device 1 according to the present embodiment, an electronic device according to a comparative example will be described. FIG. 3 is a schematic view of an electronic device 101 according to a comparative example that does not include the configuration of the electronic device 1. In addition, FIG. 4 is a cross-sectional view of the electronic device 101 according to the comparative example.

Figure 4:
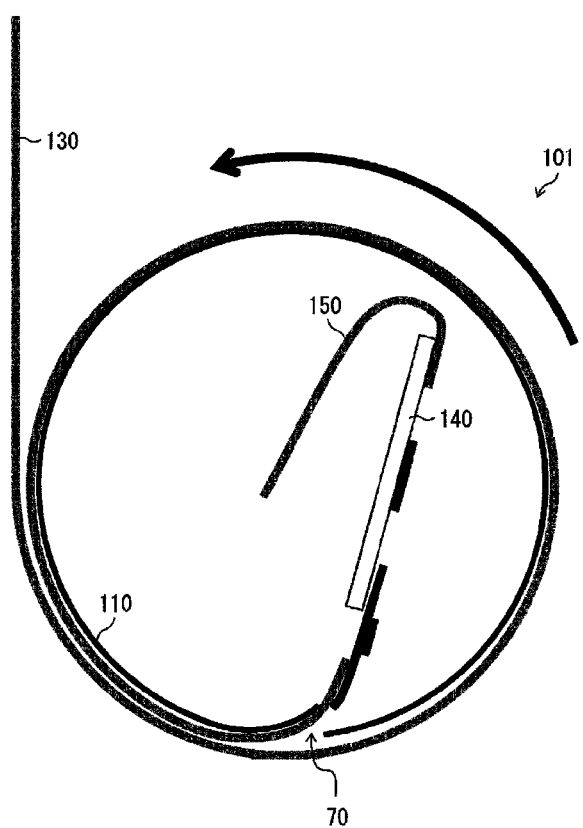
FIG. 4 is a cross-sectional view of the electronic device according to the comparative example.

As illustrated in FIG. 3 and FIG. 4, the electronic device 101 does not include a member corresponding to the second support body 20 of the electronic device 1, and in a case where a first support body 110 rotates, twisting of the external connection cable 150 occurs and causes deterioration and disconnection of the external connection cable 150.

On the other hand, as described above, the electronic device 1 according to the present embodiment includes the electronic component (display) 30 having flexibility, the drive circuit substrate 40 connected to the electronic component 30 and the external connection cable 50 through which a signal is propagated, the first support body 10 capable of housing the drive circuit substrate 40, the first support body 10 being capable of winding at least a portion of the electronic component 30 around the outer face, and the second support body 20 including the center axis that is the same axis as the rotation axis of the first support body 10 and including the outer periphery having the length smaller than the length of the outer periphery of the first support body 10, the second support body 20 being capable of winding at least a portion of the external connection cable 50 around the outer face. Accordingly, the electronic device 1 capable of suppressing twisting of the external connection cable 50 can be realized.

However, the length of the outer periphery of the second support body 20 is preferably smaller than the length of the outer periphery of the first support body 10, but particularly in a case where the external connection cable 50 is long, the length of the outer periphery of the second support body 20 may not necessarily be smaller than the length of the outer periphery of the first support body 10.

Note that the "housing" described above includes not only a state of containing but also, as described below, a state where, in a case where the electronic component 30 is wound around the first support body 10, the drive circuit substrate 40 is accommodated at a predetermined position in the exterior of the first support body 10.

In addition, a portion of the external connection cable 50 stops with respect to the first support body 10 in a state where the external connection cable 50 is wound around the second support body 20 and also in a state where the external connection cable 50 is fed out, that is, a state where the external connection cable 50 is drawn out. In contrast, a position of a portion wound around the second support body 20 of the external connection cable 50 with respect to the first support body 10 and the second support body 20 changes in a state where the external connection cable 50 is wound and in a state where the external connection cable 50 is fed out. That is, it can be said that each portion of the external connection cable 50 can be classified into any of a fixing portion fixed with respect to the first support body 10 and a winding portion wound around the second support body 20. In addition, the fixing portion connected to the drive circuit substrate 40 is fixed, and thus interference of the winding of the external connection cable 50 with the drive circuit substrate 40 can be suppressed.

In addition, as described above, the external connection cable 50 may extend from the fixing portion toward the second support body 20, and the external connection cable 50 extending from the first support body 10 may be wound around the second support body 20. Accordingly, a tangle of the external connection cable 50 can further be suppressed.

Configuration Example of Display 30

Hereinafter, a configuration example of the display 30 will be described below with reference to FIGS. 5 to 7. Note that hereinafter, the "same layer" means that layers are formed in the same process, a "lower layer" means that a layer is formed in a process prior to a process where a layer for comparison is formed, and an "upper layer" means that a layer is formed in a process subsequent to a process where a layer for comparison is formed.

Figure 5:
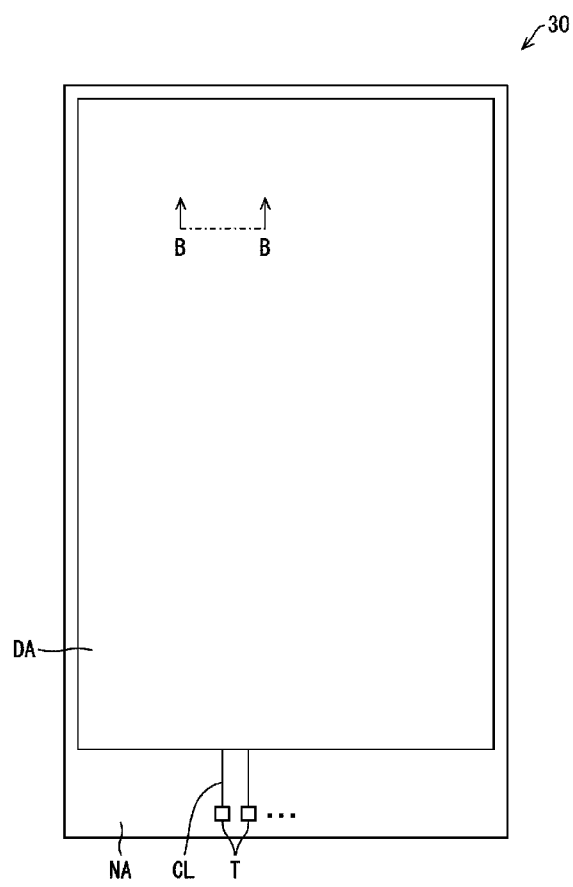
FIG. 5 is a top view of a display according to the present embodiment.

FIG. 5 is a top view of the display 30 according to the present embodiment. FIG. 6 is an arrow cross-sectional view taken along line B-B in FIG. 5. As illustrated in FIG. 5, the display 30 according to the present embodiment includes a display region DA and a frame region NA adjacent to a periphery of the display region DA. As illustrated in FIG. 5, the terminal portion T connected to the drive circuit substrate 40 via a flexible cable or the like is formed in one end portion of the frame region NA. A driver not illustrated or the like that supplies a signal for driving each light-emitting element in the display region DA via a connection wiring line CL from the display region DA is mounted in the terminal portion T.

Here, a configuration of each layer in the display region DA of the display 30 according to the present embodiment will be described in detail with reference to FIG. 6.

Figure 6:
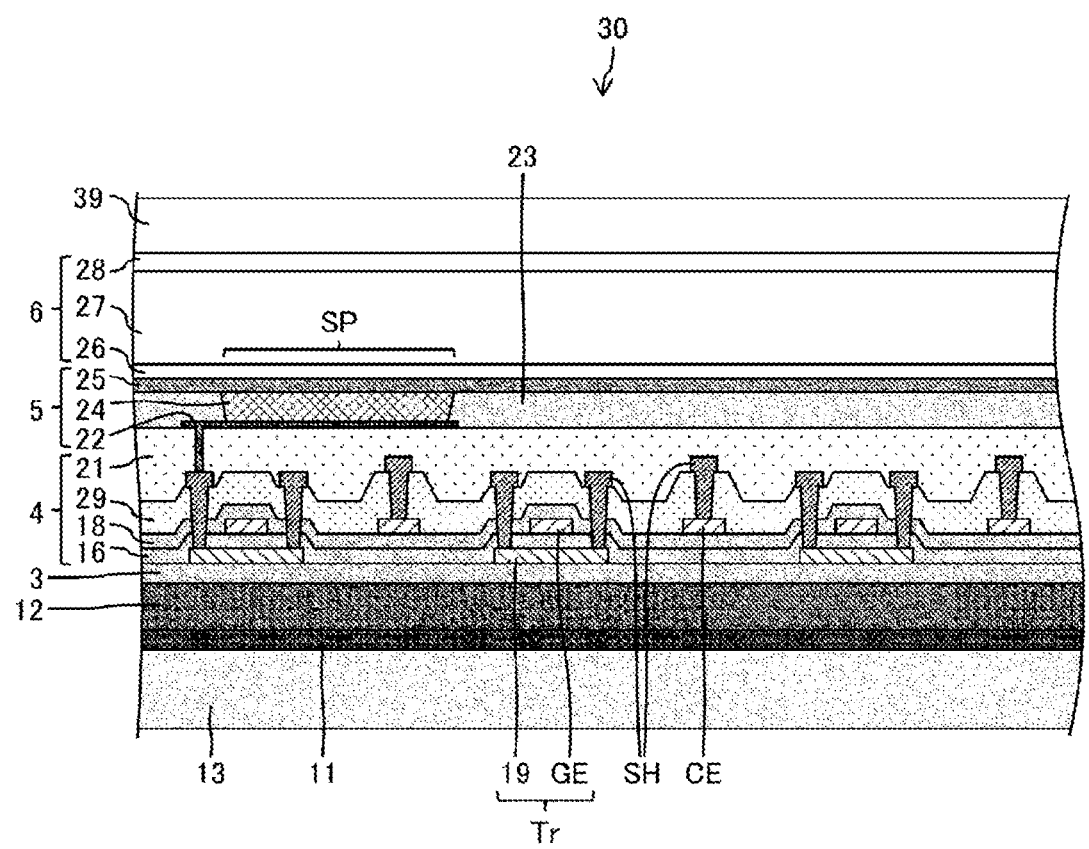
FIG. 6 is an arrow cross-sectional view taken along line B-B in FIG. 5.
Figure 7:
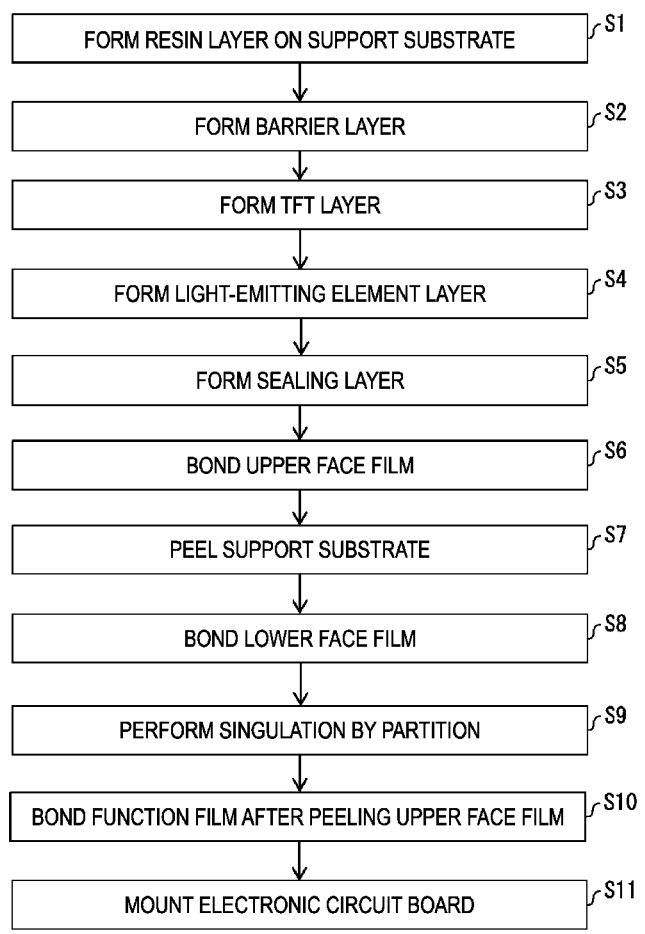
FIG. 7 is a flowchart of a method for manufacturing the display.

As illustrated in FIG. 6, the display 30 according to the present embodiment includes a lower face film 13, an adhesive layer 11, a resin layer 12, a barrier layer 3, a TFT layer 4, a light-emitting element layer 5, and a sealing layer 6 in order from the lower layer. The display 30 may further include a function film 39 including an optical compensation function, a touch sensor function, a protection function, and the like, in the upper layer of the sealing layer 6.

The lower face film 13 is a base material film of the display 30 and may include, for example, an organic resin material. The adhesive layer 11 is a layer that bonds the lower face film 13 and the resin layer 12, and may be formed by using a known adhesive of the related art. The resin layer 12 includes polyimide as a material.

The barrier layer 3 is a layer that prevents foreign matters such as water and oxygen from infiltrating the TFT layer 4 and the light-emitting element layer 5 when the display 30 is used. The barrier layer 3 can include, for example, a silicon oxide film, a silicon nitride film, or a silicon oxynitride film that is formed by CVD, or a layered film of these films.

The TFT layer 4 includes a semiconductor film, a first inorganic insulating film 16 (a gate insulating film), a gate electrode GE, a second inorganic insulating film 18, a capacitance electrode CE, a third inorganic insulating film 29, a source wiring line SH (a metal wiring line layer), and a flattening film 21 (an interlayer insulating film) in order from the lower layer. A thin film transistor (TFT) Tr is constituted and includes the semiconductor film, the first inorganic insulating film 16, and the gate electrode GE.

The semiconductor film includes, for example, low-temperature polysilicon (LTPS) or an oxide semiconductor. Note that in FIG. 5, the TFT including the semiconductor film as a channel is illustrated with a top gate structure, but a bottom gate structure may be employed (for example, in a case where the channel of the TFT is an oxide semiconductor).

The gate electrode GE, the capacitance electrode CE, or the source wiring line SH may include, for example, at least one of aluminum (Al), tungsten (W), molybdenum (Mo), tantalum (Ta), chromium (Cr), titanium (Ti), and copper (Cu). That is, the gate electrode GE, the capacitance electrode CE, or the source wiring line SH includes a single-layer film or a layered film of any of the metals described above.

The first inorganic insulating film 16, the second inorganic insulating film 18, and the third inorganic insulating film 29 can include, for example, a silicon oxide (SiOx) film or a silicon nitride (SiNx) film that is formed by CVD, or a layered film of these films.

The flattening film 21 can include, for example, a coatable photosensitive organic material such as polyimide and acrylic.

The light-emitting element layer (for example, an organic light-emitting diode layer) 5 includes a pixel electrode 22 (a first electrode, for example, an anode), a cover film 23 (an edge cover) that covers an edge of the pixel electrode 22, a light-emitting layer 24, and an upper electrode (a second electrode, for example, a cathode) 25 in order from the lower layer. The light-emitting element layer 5 is provided with, on a subpixel SP (pixel)-by-subpixel SP basis, a light-emitting element (for example, an organic light emitting diode (OLED)) including the pixel electrode 22 having an island shape, the light-emitting layer 24 having an island shape, and the upper electrode 25, and a subpixel circuit that drives the light-emitting element. In addition, in the TFT layer 4, the transistor Tr is formed on the subpixel circuit-by-subpixel circuit basis, and the subpixel circuit is controlled by control of the transistor Tr.

In a plane view, the pixel electrode 22 is provided at a position where the pixel electrode 22 overlaps the flattening film 21 and a contact hole that is an opening of the flattening film 21. The pixel electrode 22 is electrically connected to the source wiring line SH via the contact hole. Thus, a signal in the TFT layer 4 is supplied to the pixel electrode 22 via the source wiring line SH. Note that the thickness of the pixel electrode 22 may be, for example, 2 nm.

The pixel electrode 22 is formed in an island shape on the subpixel SP-by-subpixel SP basis of a plurality of the subpixels SP, and is constituted by, for example, layering indium tin oxide (ITO) and an alloy including Ag, and the pixel electrode 22 has light reflectivity. The upper electrode 25 is formed in a solid-like shape as a common layer for the plurality of subpixels SP and can include a transparent conductive material such as indium tin oxide (ITO) and indium zinc oxide (IZO).

The cover film 23 is an organic insulating film, and is formed at a position where the cover film 23 covers the edge of the pixel electrode 22, and the cover film 23 includes an opening 23c on the subpixel SP-by-subpixel SP basis of the plurality of subpixels SP, and a portion of the pixel electrode 22 is exposed. The cover film 23 can include a coatable material such as polyimide.

The light-emitting layer 24 is constituted by, for example, layering a hole transport layer, a light-emitting layer, and an electron transport layer in order from the lower layer side. In the present embodiment, at least one layer of the light-emitting layer 24 is formed by vapor deposition. In addition, in the present embodiment, each layer of the light-emitting layer 24 may be formed in an island shape on the subpixel SP-by-subpixel SP basis or may be formed in a solid-like shape as a common layer for the plurality of subpixels SP.

In a case where the light-emitting element layer 5 is an OLED layer, a positive hole and an electron are recombined inside the light-emitting layer 24 by a drive current between the pixel electrode 22 and the upper electrode 25, and the exciton thus generated falls to a ground state, and accordingly light is emitted. The upper electrode 25 is transparent and the pixel electrode 22 has light reflectivity, and thus light emitted from the light-emitting layer 24 is directed upward and top-emitting is realized.

The sealing layer 6 includes a first inorganic sealing film 26 in an upper layer overlying the upper electrode 25, an organic sealing film 27 in an upper layer overlying the first inorganic sealing film 26, and a second inorganic sealing film 28 in an upper layer overlying the organic sealing film 27, and prevents foreign matters such as water and oxygen from infiltrating the light-emitting element layer 5. Each of the first inorganic sealing film 26 and the second inorganic sealing film 28 can include, for example, a silicon oxide film, a silicon nitride film, or a silicon oxynitride film that is formed by CVD, or a layered film of these films. The organic sealing film 27 can include a coatable photosensitive organic material such as polyimide and acrylic.

A method for manufacturing the display 30 according to the present embodiment will be described in detail with reference to a flowchart of FIG. 7.

First, the resin layer 12 is formed on a support substrate S that is, for example, a transparent mother glass substrate (step S1). Then, the barrier layer 3 is formed (step S2). Then, the TFT layer 4 is formed in an upper layer of the barrier layer 3 (step S3). At this time, the terminal portion T and the connection wiring line CL may be formed.

Then, the light-emitting element layer of a top-emitting type (for example, an OLED element layer) 5 is formed (step S4). At step S4, each layer of the light-emitting element layer 5 may be formed by known technique of the related art, and, particularly, the light-emitting layer 24 may be formed by vapor deposition or the like. Then, the sealing layer 6 is formed (step S5).

Then, an upper face film is bonded to an upper face of the sealing layer 6 (step S6). The upper face film may be bonded to the upper face of the sealing layer 6 and may include the same material as the material of the lower face film 13. As with the lower face film 13, the upper face film may be bonded to the sealing layer 6 via an adhesive layer.

Then, the support substrate S is peeled from the resin layer 12 (step S7). The peeling of the support substrate S may be executed by, for example, technique of irradiating a lower face of the resin layer 12 with laser light over the support substrate S, reducing bonding force of the support substrate S and the resin layer 12, and peeling the support substrate S from the resin layer 12.

Then, the lower face film 13 is bonded to a lower face of each structure via the adhesive layer 11 (step S8). Then, a layered body from the lower face film 13 to the upper face film is subjected to partition and singulation (step S9). Then, after the upper face film is peeled from the sealing layer 6, the function film 39 is bonded to an upper face of each layered body subjected to the singulation (step S10). Then, an electronic circuit board (for example, an IC chip) is mounted on the terminal portion T, and the display 30 is formed (step S11).

Second Embodiment

Hereinafter, a second embodiment of the disclosure will be described. Note that, for convenience of description, a member including the same function as the function of the member described in the embodiment described above will be denoted by the same reference sign, and description of such a member will not be repeated.

In the present embodiment, an example of a configuration where at least a portion of an outer periphery of a cross section of a second support body 20 has a linear shape, and at least a portion of an external connection cable 50 is fixed to at least a portion of a touch surface where the at least a portion of the external connection cable 50 touches an outer periphery portion having the linear shape of the second support body 20 will be described.

Figure 8:
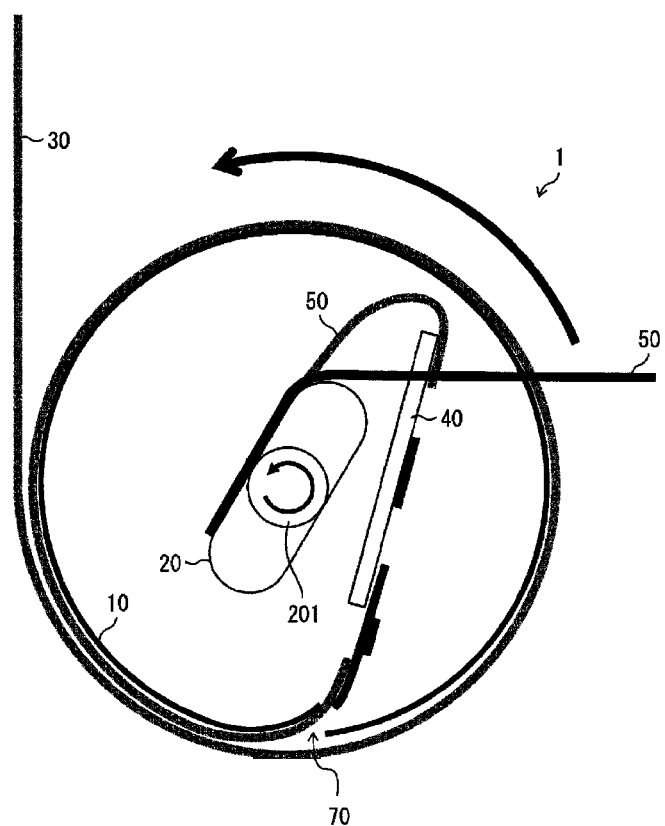
FIG. 8 is a cross-sectional view of the electronic device according to the second embodiment.

FIG. 8 is a cross-sectional view of an electronic device 1 according to the present embodiment. As illustrated in FIG. 8, the cross section of the second support body 20 according to the present embodiment includes a linear portion in the outer periphery. In other words, a portion of a surface of the second support body 20 is flat. In addition, the length of any of sides of a flat rectangular portion is the same as or greater than the width of the external connection cable 50. In addition, a circle 201 represents a rotation axis of the second support body 20.

In addition, at least a portion of the external connection cable 50 may be fixed to the second support body 20 in a touch surface where the at least a portion of the external connection cable 50 touches the second support body 20. Accordingly, twisting of the external connection cable 50 can further be suppressed, and in addition, interference of the pulling of the external connection cable 50 with a drive circuit substrate 40 can also be suppressed.

Particularly, the external connection cable 50 may be fixed to the second support body 20 in a touch surface where the external connection cable 50 touches the flat portion of the second support body 20. The external connection cable 50 is fixed in the flat portion, and accordingly, the external connection cable 50 can be fixed to the second support body 20 more easily and stably.

Figure 9:
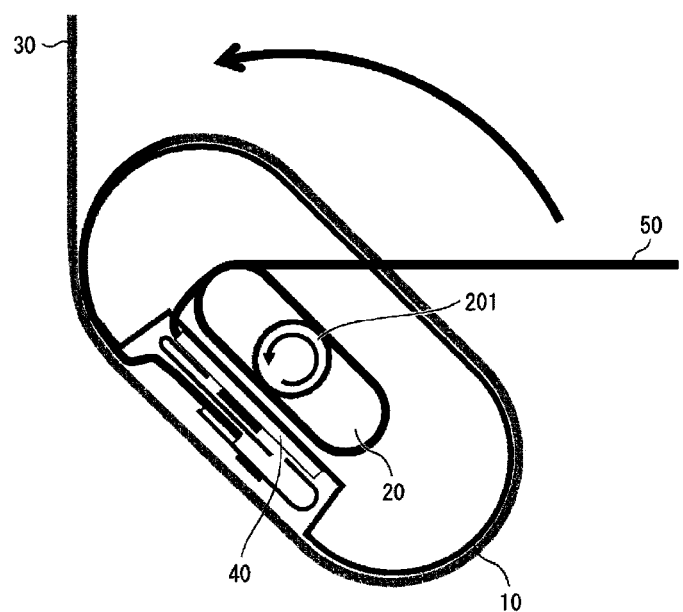
FIG. 9 is a cross-sectional view of an electronic device according to a modification of the second embodiment.

Note that as illustrated in FIG. 9 described below, as with the second support body 20, a shape of a portion of a surface of a first support body 10 may also be flat. The shape of the first support body 10 and the shape of the second support body 20 are made uniform, an thus a display 30 and the external connection cable 50 can be wound more stably.

Modification of Second Embodiment

A modification of the second embodiment will be described. FIG. 9 is a view representing a cross-sectional view of an electronic device 1 according to the present example. As illustrated in FIG. 9, the electronic device 1 according to the present example includes a configuration where a drive circuit substrate 40 is positioned in the exterior of a first support body 10.

In addition, in an outer face of the first support body 10, a depression is formed and houses the drive circuit substrate 40. Due to this depression, in a case where the first support body 10 winds a display 30, the display 30 does not interfere with the drive circuit substrate 40. According to the configuration of the present example, for example, in a case where maintenance or the like is performed, the drive circuit substrate 40 does not need be fed out from the first support body 10, and thus, time and work can be reduced.

Third Embodiment

Hereinafter, a third embodiment of the disclosure will be described. Note that, for convenience of description, a member including the same function as the function of the member described in the embodiment described above will be denoted by the same reference sign, and description of such a member will not be repeated. In the present embodiment, an example of a container that houses an electronic device 1 will be described.

A container 300 according to the present embodiment rotatably fixes a first support body 10 and a second support body 20 at predetermined positions. In addition, the container 300 may include a connection section 80 that connects an external connection cable 50 and an external controller 60. The connection section 80 is electrically connected to the external controller 60 and physically connects the external connection cable 50. Note that the connection section 80 may be regarded as a section provided in the electronic device 1. The external connection cable 50 and the external controller 60 are connected via the connection section 80, and accordingly, the external controller 60 can be fixed to a predetermined position while the external controller 60 is detachable.

In addition, when the external connection cable 50 is fed out and is loosened, the loosening of the external connection cable 50 causes a tangle of the external connection cable 50. Hereinafter, a configuration example where the loosening of the external connection cable 50 in a case where the external connection cable 50 is fed out is resolved and suppressed will be described.

FIGS. 10 to 14 are each a view illustrating a situation where a guide member 100 and an elastic member body 90 that are separately provided in the container 300 act on the external connection cable 50. As an example, the guide member 100 is described as being a roller that functions as a pulley with respect to the external connection cable 50, and the elastic member body 90 is described as being a spring, but the embodiment is not limited to this example.

Figure 10:
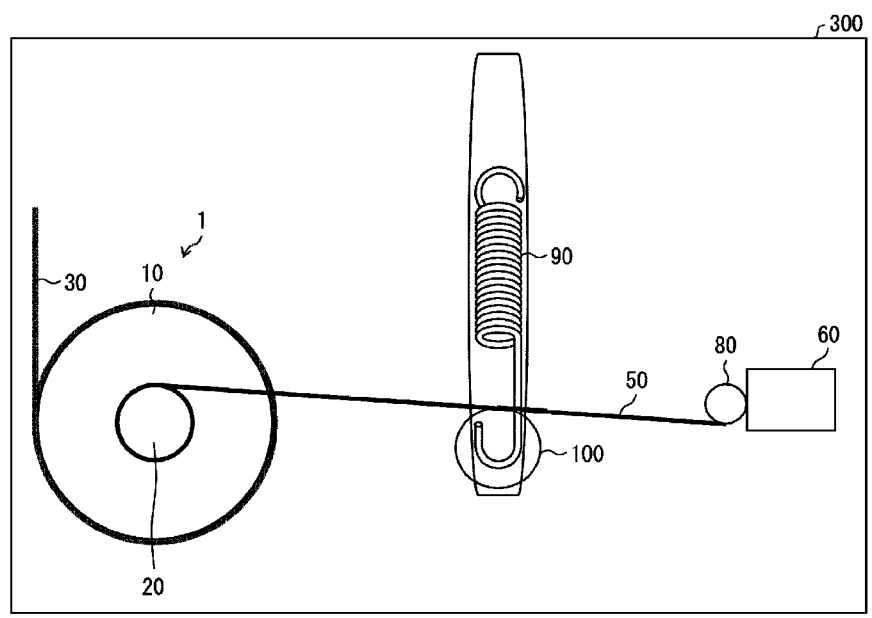
FIG. 10 is a view illustrating a state where a display and an external connection cable are wound around a first support body and a second support body, respectively.
Figure 11:
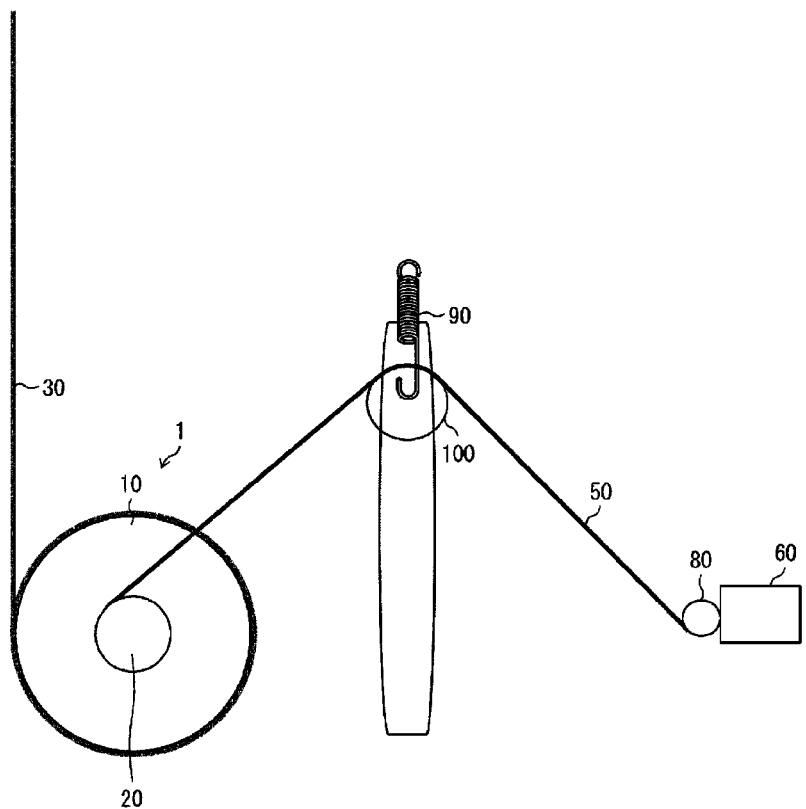
FIG. 11 is a view illustrating a state where the display and the external connection cable are fed out from the first support body and the second support body, respectively.

Here, FIG. 10 is a view illustrating a state where a display 30 and the external connection cable 50 are wound around the first support body 10 and the second support body 20, respectively. In addition, FIG. 11 is a view illustrating a state where the display 30 and the external connection cable 50 are fed out from the first support body 10 and the second support body 20, respectively. Note that among the figures according to the present embodiment, in FIG. 11 and the figures subsequent to FIG. 11, a rectangle representing a housing portion of the container 300 is omitted.

As can be seen from FIGS. 10 and 11, force is applied to the guide member 100 by the elastic member body 90 in a direction in which the elastic member body 90 is compressed, and, in a state illustrated in FIG. 11, that is, in a case where the external connection cable 50 is fed out, the guide member 100 moves in that direction, that is, in a direction in which the external connection cable 50 is stretched, and the loosening of the external connection cable 50 is resolved.

Figure 12:
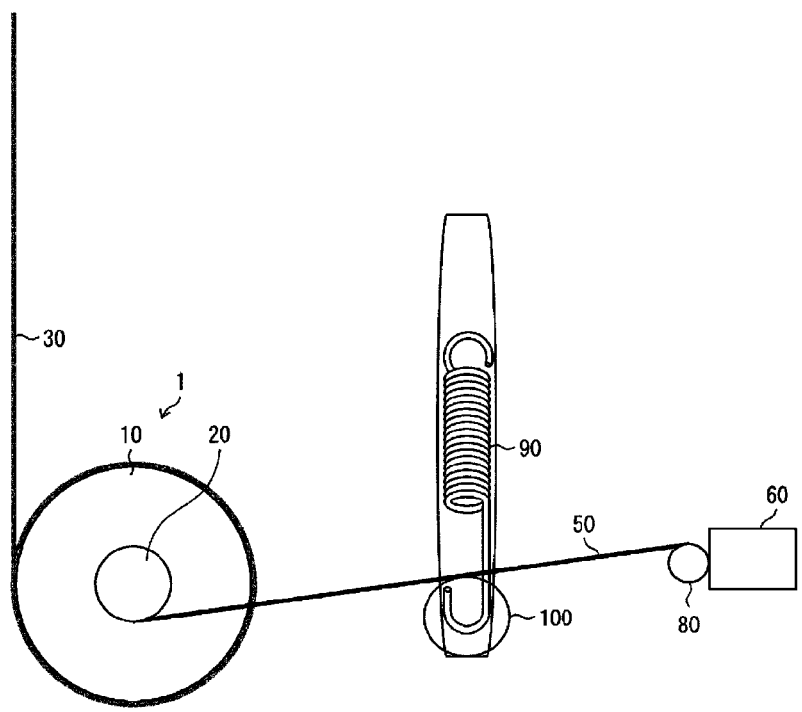
FIG. 12 is a view illustrating a configuration example of an electronic device.
Figure 13:
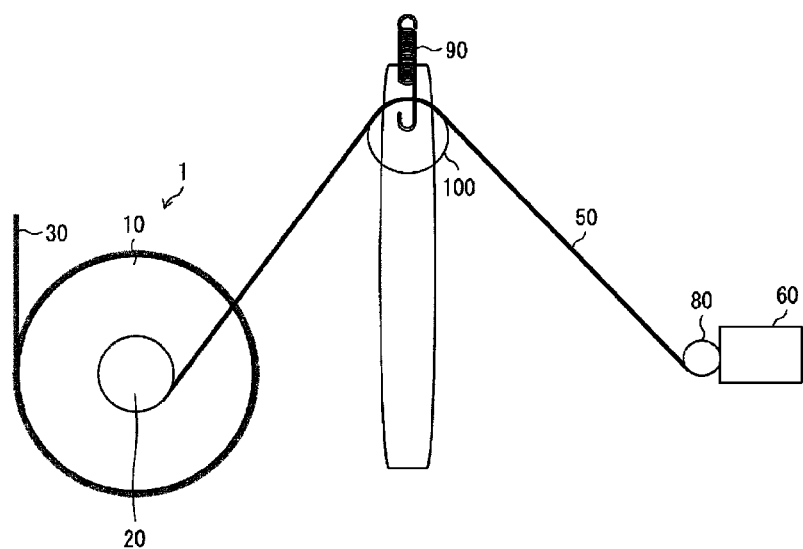
FIG. 13 is a view illustrating a configuration example of the electronic device.

The electronic device 1 illustrated in each of FIGS. 10 and 11 includes the configuration where, in a case where the display 30 is wound around an outer face of the first support body 10, the external connection cable 50 is wound around an outer face of the second support body 20, and in a case where the display 30 is fed out from the outer face of the first support body 10, the external connection cable 50 is fed out from the outer face of the second support body 20, but the electronic device 1 may include a reverse configuration. FIGS. 12 and 13 are each a view illustrating the electronic device 1 in the reverse configuration. In the configuration illustrated in each of FIG. 12 and FIG. 13, the external connection cable 50 is fed out from a side corresponding to a lower side of the second support body 20 in each of the figures, and accordingly, in a case where the display 30 is wound around the outer face of the first support body 10, the external connection cable 50 is fed out from the outer face of the second support body 20, and in a case where the display 30 is fed out from the outer face of the first support body 10, the external connection cable 50 is wound around the outer face of the second support body 20.

Figure 14:
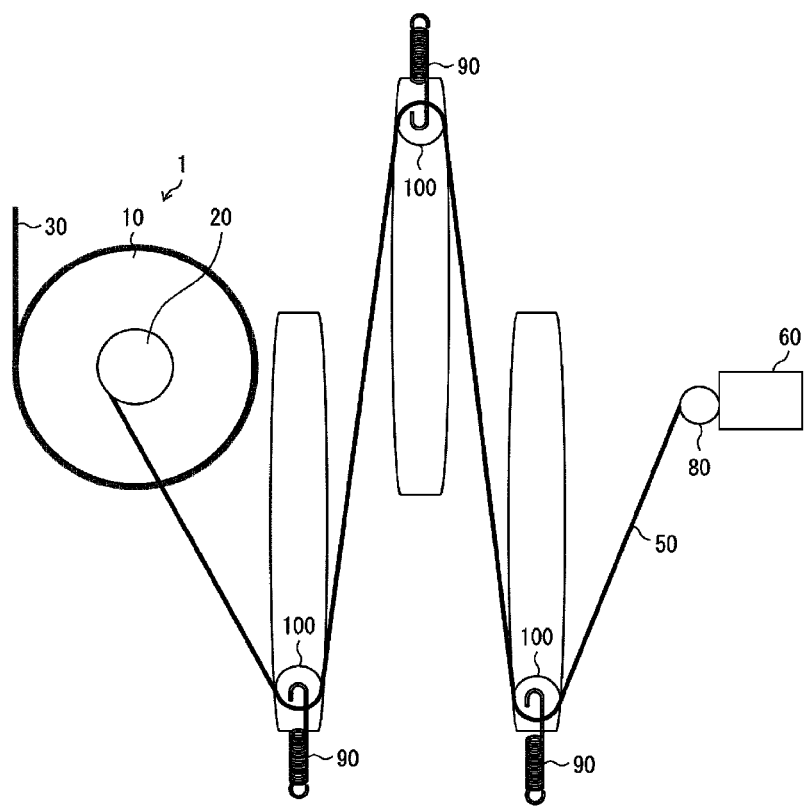
FIG. 14 is a view illustrating a configuration where an external connection cable passes through a plurality of guide members.

In addition, a configuration where the external connection cable 50 fed out from the second support body 20 passes through a plurality of the guide members 100 until the external connection cable 50 is at or near the connection section 80 or the external controller 60 may be employed. FIG. 14 is a view illustrating an example of such a configuration. In such a configuration, as illustrated in FIG. 14, a set of the guide member 100 and the elastic member body 90 and a set of the guide member 100 and the elastic member body 90 that is adjacent to the set of the guide member 100 and the elastic member body 90 can be disposed alternately.

Figure 15:
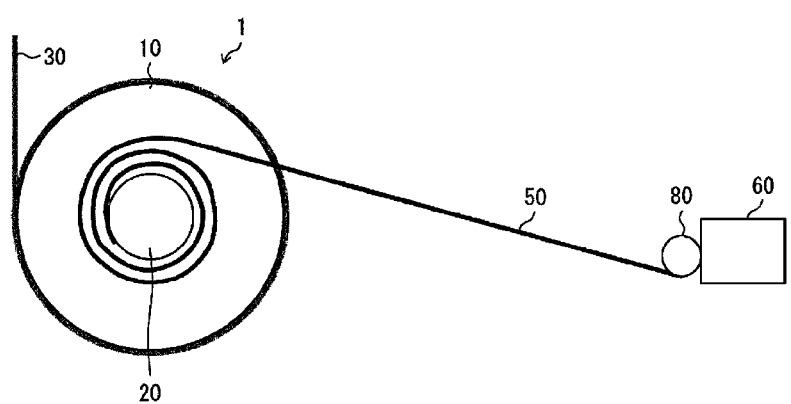
FIG. 15 is a view illustrating a configuration where a power spring is bonded to an external connection cable.

In addition, a configuration where the external connection cable 50 includes a power spring with respect to at least a portion wound around the second support body 20 may be employed. FIG. 15 is a view illustrating an example of such a configuration. In a case where the external connection cable 50 is fed out from the outer face of the second support body 20, the power spring acts and retains at least a portion of the external connection cable 50 in a periphery of the second support body 20, and the loosening of the external connection cable 50 is resolved. In FIG. 15, the power spring is bonded to a portion wound around the second support body 20 of the external connection cable 50, and in a case where the second support body 20 rotates clockwise, a diameter of a vortex of the portion wound increases, and in a case where the second support body 20 rotates counterclockwise, the diameter of the vortex of the portion wound decreases. Note that a material and a shape of the power spring are not limited to a specific material and a specific shape.

Note that a configuration where the external connection cable 50 has characteristics similar to the characteristics of the power spring described above is also encompassed in the aspect of the present embodiment. In such a configuration, in a case where the external connection cable 50 is fed out from the outer face of the second support body 20, the external connection cable 50 itself acts and is retained in a periphery of the second support body 20, and the loosening of the external connection cable 50 is resolved.

Modification of Third Embodiment

Figure 16:
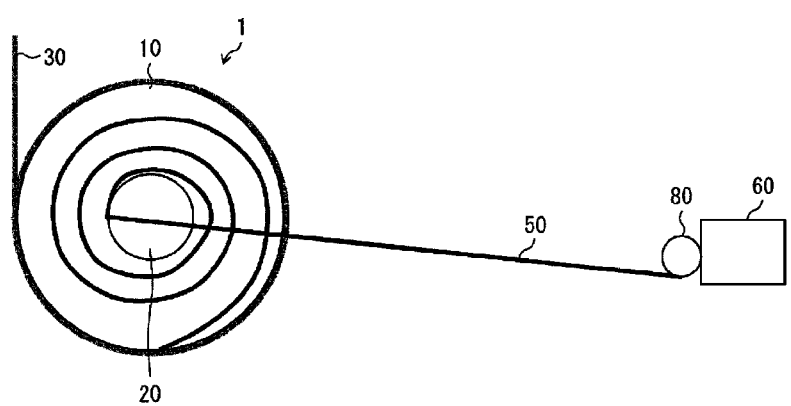
FIG. 16 is a view illustrating a configuration where an external connection cable functions as a power spring.

In a case where a first support body 10 and a second support body 20 are not fixed to each other, a configuration where an external connection cable 50 provided with a power spring or the external connection cable 50 having characteristics similar to characteristics of the power spring functions as the power spring may be employed. FIG. 16 is a view illustrating an example of such a configuration. Here, a rotation axis of the first support body 10 and a center axis of the second support body 20 are the same axis. Note that an electronic device 1 according to the present example includes a mechanism not illustrated where an electronic component 30 is fixed in a state where the electronic component 30 is fed out.

In a case where the electronic component 30 is fed out from the first support body 10, the first support body 10 rotates, and the second support body 20 does not rotate. Accordingly, the external connection cable 50 functioning as the power spring applies force in a direction in which the first support body 10 winds the electronic component 30. Accordingly, the electronic component 30 can be wound easily around the first support body 10 in a similar manner to housing of cord of a cleaner or the like.

Fourth Embodiment

Hereinafter, a fourth embodiment of the disclosure will be described. Note that, for convenience of description, a member including the same function as the function of the member described in the embodiment described above will be denoted by the same reference sign, and description of such a member will not be repeated. In the present embodiment, an example of a configuration where, in a case where a display 30 is fed out, a drive circuit substrate 40 separates from a first support body 10 will be described.

Figure 17:
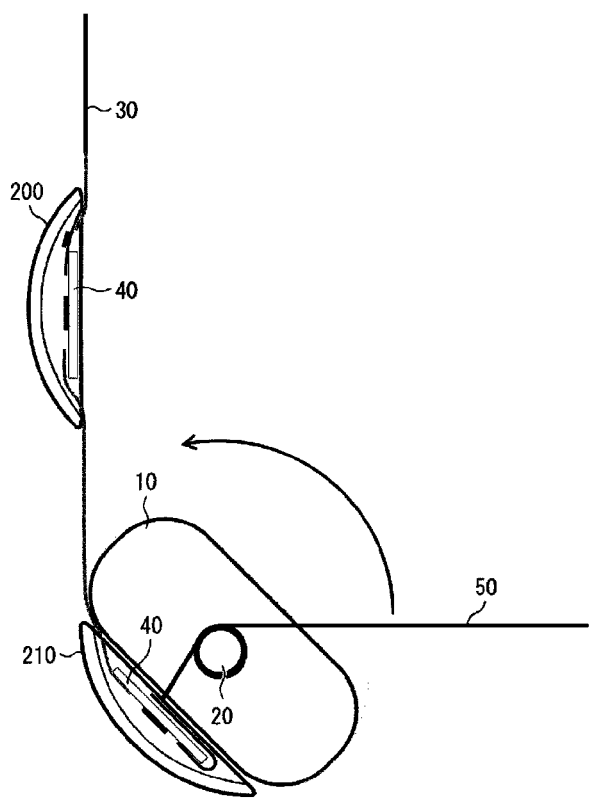
FIG. 17 is a cross-sectional view of an electronic device according to a fifth embodiment.

FIG. 17 is a cross-sectional view of an electronic device 1 according to the present embodiment. As illustrated in FIG. 17, a plurality of the drive circuit substrates 40 in the present embodiment are not positioned in the interior of the first support body 10, but are positioned at a plurality of locations in the exterior of the first support body 10, respectively.

Note that a configuration where, in a case where the display 30 is wound around the first support body 10, or in a case where the display 30 is fed out from the first support body 10, the external connection cable 50 connected to the drive circuit substrate 40 is wound around a second support body 20 is similar to the configuration of each of the embodiments described above.

The electronic device 1 according to the present embodiment further includes covers 200 and 210 that protect the drive circuit substrates 40. In addition, a portion to which each of the covers 200 and 210 is fitted in an outer face of the first support body 10 is flat, and each of the covers fits to the portion. In addition, in a case where the covers 200 and 210 are fitted to the first support body 10, each of the covers 200 and 210 includes all the cross section having a gentle shape, in this example, a curved shape such as a circle or an oval. Accordingly, in a case where the display 30 is wound around the outer face, concentration of a load on a specific location in the display 30 can be suppressed.

In addition, the cover 210 may be fixed and may not be movable from the first support body 10, or may be removable from the first support body 10. In addition, the covers 200 and 210 may be fixed and may be prevented from deviating from predetermined positions in the first support body 10 by using a removable member, for example, a magnet, a joint, or the like. In addition, the number of the covers is not limited to two and may be one or three or more. In other words, arrangement places of the plurality of drive circuit substrates 40 may be aggregated at one location or may be distributed at a plurality of locations via a cable. In addition, a position of each cover is not limited. Particularly, quality of an image displayed by the display 30 can be improved by shortening a distance between the drive circuit substrate 40 and the display 30.

Note that in a case where the display 30 according to each of the embodiments described above is a display, the display is not particularly limited as long as the display is a display panel having flexibility and including a bendable display element. In the display element described above, there are a display element having luminance or transmittance controlled by a current, and a display element having luminance or transmittance controlled by a voltage. As the current-controlled display element, there is an organic electroluminescence (EL) display including an organic light emitting diode (OLED), a quantum dot light emitting diode (QLED) display including an EL display QLED such as an inorganic EL display including an inorganic light emitting diode, or the like. In addition, as the voltage-controlled display element, there is a liquid crystal display element or the like.

Supplement

An electronic device (1) according to aspect 1 of the disclosure is an electronic device including an electronic component (30) having flexibility, a drive circuit substrate (40) connected to the electronic component and an external connection cable (50) through which a signal is supplied to the electronic component. a first support body (10) capable of housing the drive circuit substrate, the first support body being capable of winding at least a portion of the electronic component around an outer face, and a second support body (20) including a center axis that is the same axis as a rotation axis of the first support body and including an outer periphery having a length smaller than a length of an outer periphery of the first support body, the second support body being capable of winding at least a portion of the external connection cable around an outer face. According to the configuration described above, the electronic device capable of suppressing twisting of the external connection cable 50 can be realized.

The electronic device according to aspect 2 of the disclosure may be the electronic device according to aspect 1 described above, further including an external controller (60) that is a supply source of a signal, wherein one side of the external connection cable is electrically connected to the drive circuit substrate, and the other side of the external connection cable is electrically connected to the external controller via the second support body. According to the configuration described above, a signal can be transmitted from the external controller to the drive circuit substrate.

The electronic device according to aspect 3 of the disclosure may be the electronic device according to aspect 1 or 2 described above, wherein at least a portion of the external connection cable is fixed to the second support body in a touch surface where the at least a portion of the external connection cable touches the second support body. According to the configuration described above, twisting of the external connection cable can further be suppressed, and in addition, interference of the pulling of the external connection cable with the drive circuit substrate can also be suppressed.

The electronic device according to aspect 4 of the disclosure may be the electronic device according to aspect 3 described above, wherein at least a portion of an outer periphery of a cross section of the second support body has a linear shape, and at least a portion of the external connection cable is fixed to at least a portion of a touch surface where the at least a portion of the external connection cable touches an outer periphery portion having a linear shape of the second support body. According to the configuration described above, the external connection cable can be fixed to the second support body more easily and stably.

The electronic device according to aspect 5 of the disclosure may be the electronic device according to any one of aspects 1 to 4 described above, wherein the external connection cable includes a fixing portion fixed to the first support body, and a winding portion wound around the second support body. According to the configuration described above, interference of the winding of the external connection cable with the drive circuit substrate can be suppressed.

The electronic device according to aspect 6 of the disclosure may be the electronic device according to aspect 5 described above, wherein the external connection cable extends from the fixing portion toward the second support body, and the external connection cable extending from the first support body is wound around the second support body. According to the configuration described above, tangling of the external connection cable can further be suppressed.

The electronic device according to aspect 7 of the disclosure may be the electronic device according to any one of aspects 1 to 6 described above, wherein in a case where the electronic component is wound around the outer face of the first support body, the external connection cable is wound around the outer face of the second support body, and in a case where the electronic component is fed out from the outer face of the first support body, the external connection cable is fed out from the outer face of the second support body. According to the configuration described above, the electronic device where the external connection cable is wound in a case where the electronic component is wound can be realized.

The electronic device according to aspect 8 of the disclosure may be the electronic device according to any one of aspects 1 to 6 described above, wherein in a case where the electronic component is wound around the outer face of the first support body, the external connection cable is fed out from the outer face of the second support body, and in a case where the electronic component is fed out from the outer face of the first support body, the external connection cable is wound around the outer face of the second support body. According to the configuration described above, the electronic device where the external connection cable is wound in a case where the electronic component is fed out can be realized.

The electronic device according to aspect 9 of the disclosure may be the electronic device according to any one of aspects 1 to 8 described above, wherein the second support body includes a rotation axis that is the same as the rotation axis of the first support body and is fixed to the first support body. According to the configuration described above, tangling of a portion straddling the first support body and the second support body of the external connection cable can be suppressed.

The electronic device according to aspect 10 of the disclosure may be the electronic device according to any one of aspects 1 to 9 described above, wherein the external connection cable includes a power spring with respect to at least a portion wound around the second support body, and in a case where the external connection cable is fed out from the outer face of the second support body, the power spring acts and retains at least a portion of the external connection cable in a periphery of the second support body. According to the configuration described above, in a case where the external connection cable is fed out from the outer face of the second support body, the power spring acts and retains at least a portion of the external connection cable in the periphery of the second support body, and the loosening of the external connection cable can be resolved.

The electronic device according to aspect 11 of the disclosure may be the electronic device according to any one of aspects 1 to 10 described above, wherein the first support body is a first support body that is hollow and that contains the drive circuit substrate, and the first support body is capable of winding around the outer face at least a portion of the electronic component that is positioned in an exterior via a slit. According to the configuration described above, the electronic device containing the drive circuit substrate can be realized.

The electronic device according to aspect 12 of the disclosure may be the electronic device according to any one of aspects 1 to 11 described above, wherein the electronic component is a display. According to the configuration described above, the electronic device capable of winding the display can be realized.

The electronic device according to aspect 13 of the disclosure may be the electronic device according to aspect 12 described above, wherein the display is an OLED display. According to the configuration described above, the electronic device capable of suppressing a twist of the external connection cable in a case where the OLED display is wound can be realized.

A container (300) according to aspect 14 of the disclosure may be a container that houses the electronic device according to aspect 2, the container including a connection section (80) fixed to a connection position, the connection section being electrically connected to the external controller and physically connecting the external connection cable, wherein the first support body and the second support body are fixed to positions where the first support body and the second support body are rotatable. According to the configuration described above, the container that rotatably fixes the first support body and the second support body and that can detachably fix the external controller at a predetermined position by connecting the external connection cable and the external controller via the connection section can be realized.

The container according to aspect 15 of the disclosure may be the container according to aspect 14 described above, further including a guide member (100) abutting on the external connection cable, and an elastic member body (90) configured to apply force to the guide member in a direction in which slack in the external connection cable is tightened. According to the configuration described above, the container capable of resolving the loosening of the external connection cable in a case where the external connection cable is fed out can be realized.

The disclosure is not limited to each of the embodiments described above, and various modifications can be made within the scope of the claims. An embodiment obtained by appropriately combining the technical approaches disclosed in each of the different embodiments also falls within the technical scope of the disclosure. Further, a novel technical feature can be formed by combining the technical approaches disclosed in each of the embodiments.

The invention claimed is:

1. An electronic device comprising:
   an electronic component having flexibility;
   a drive circuit substrate connected to the electronic component and an external connection cable through which a signal is propagated;
   a first support body capable of housing the drive circuit substrate, the first support body being capable of winding at least a portion of the electronic component around an outer face of the first support body; and
   a second support body including a center axis that is the same axis as a rotation axis of the first support body and including an outer periphery having a length smaller than a length of an outer periphery of the first support body, the second support body being capable of winding at least a portion of the external connection cable around an outer face of the second support body, wherein
   the electronic component, the drive circuit substrate, and the external connection cable are connected in series in this order.

2. The electronic device according to claim 1, further comprising:
   an external controller that is a supply source of a signal, wherein one side of the external connection cable is electrically connected to the drive circuit substrate, and the other side of the external connection cable is electrically connected to the external controller via the second support body.

3. A container that houses the electronic device according to claim 2, comprising:

a connection section fixed to a connection position, the connection section being electrically connected to the external controller and physically connecting the external connection cable, wherein the first support body and the second support body are fixed to positions where the first support body and the second support body are rotatable.

4. The container according to claim 3, further comprising:
a guide member abutting-en the external connection cable, and
an elastic member body configured to apply force to the guide member in a direction in which slack in the external connection cable is tightened.

5. The electronic device according to claim 1,
wherein at least one portion of the external connection cable is fixed to the second support body in a touch surface where the at least one portion of the external connection cable touches the second support body.

6. The electronic device according to claim 5,
wherein at least a portion of an outer periphery of a cross section of the second support body has a linear shape, and
the at least one portion of the external connection cable is fixed to at least a portion of the touch surface where the at least one portion of the external connection cable touches the at least one portion of the outer periphery of the cross section of the second support body having the linear shape.

7. The electronic device according to claim 1,
wherein the external connection cable includes a fixing portion fixed to the first support body, and a winding portion wound around the second support body.

8. The electronic device according to claim 7,
wherein the external connection cable extends from the fixing portion toward the second support body, and
the external connection cable extending from the first support body is wound around the second support body.

9. The electronic device according to claim 1,
wherein in a case where the electronic component is wound around the outer face of the first support body, the external connection cable is wound around the outer face of the second support body, and in a case where the electronic component is fed out from the outer face of the first support body, the external connection cable is fed out from the outer face of the second support body.

10. The electronic device according to claim 1,
wherein in a case where the electronic component is wound around the outer face of the first support body, the external connection cable is fed out from the outer face of the second support body, and in a case where the electronic component is fed out from the outer face of the first support body, the external connection cable is wound around the outer face of the second support body.

11. The electronic device according to claim 1,
wherein the second support body includes a rotation axis that is the same as the rotation axis of the first support body and is fixed to the first support body.

12. The electronic device according to claim 1,
wherein the external connection cable includes a power spring with respect to at least one portion of the external connection cable wound around the second support body, and in a case where the external connection cable is fed out from the outer face of the second support body, the power spring acts and retains at least one portion of the external connection cable in a periphery of the second support body.

13. The electronic device according to claim 1,
wherein the first support body is hollow and contains the drive circuit substrate, and the first support body is capable of winding around the outer face at least a portion of the electronic component that is positioned in an exterior via a slit.

14. The electronic device according to claim 1,
wherein the electronic component is a display.

15. The electronic device according to claim 14,
wherein the display is an OLED display.

16. An electronic device comprising:
an electronic component having flexibility;
a drive circuit substrate connected to the electronic component and an external connection cable through which a signal is propagated;
a first support body capable of housing the drive circuit substrate, the first support body being capable of winding at least a portion of the electronic component around an outer face of the first support body; and
a second support body including a center axis that is the same axis as a rotation axis of the first support body and including an outer periphery having a length smaller than a length of an outer periphery of the first support body, the second support body being capable of winding at least a portion of the external connection cable around an outer face of the second support body,
wherein in a case where the electronic component is wound around the outer face of the first support body, the external connection cable is wound around the outer face of the second support body, and in a case where the electronic component is fed out from the outer face of the first support body, the external connection cable is fed out from the outer face of the second support body.

17. An electronic device comprising:
an electronic component having flexibility;
a drive circuit substrate connected to the electronic component and an external connection cable through which a signal is propagated;
a first support body capable of housing the drive circuit substrate, the first support body being capable of winding at least a portion of the electronic component around an outer face of the first support body; and
a second support body including a center axis that is the same axis as a rotation axis of the first support body and including an outer periphery having a length smaller than a length of an outer periphery of the first support body, the second support body being capable of winding at least a portion of the external connection cable around an outer face of the second support body,
wherein in a case where the electronic component is wound around the outer face of the first support body, the external connection cable is fed out from the outer face of the second support body, and in a case where the electronic component is fed out from the outer face of the first support body, the external connection cable is wound around the outer face of the second support body.

* * * * *